(12) United States Patent
Yasuoka et al.

(10) Patent No.: US 8,053,896 B2
(45) Date of Patent: Nov. 8, 2011

(54) IC CHIP COATING MATERIAL AND VACUUM FLUORESCENT DISPLAY DEVICE USING SAME

(75) Inventors: Yusuke Yasuoka, Chiba (JP); Masahiro Kato, Chiba (JP); Teruo Watanabe, Chiba (JP); Kouji Fujiwara, Chiba (JP)

(73) Assignee: Fatuba Corporation, Chiba (JP)

( * ) Notice: Subject to any disclaimer, the term of this patent is extended or adjusted under 35 U.S.C. 154(b) by 0 days.

(21) Appl. No.: 11/353,070

(22) Filed: Feb. 14, 2006

(65) Prior Publication Data

US 2006/0180825 A1    Aug. 17, 2006

(30) Foreign Application Priority Data

Feb. 14, 2005  (JP) ................................. 2005-036344
Aug. 2, 2005   (JP) ................................. 2005-224157

(51) Int. Cl.
     *H01L 23/48* (2006.01)
(52) U.S. Cl. ................................. 257/765; 257/E31.129
(58) Field of Classification Search .................. 257/765, 257/E31.129
     See application file for complete search history.

(56) References Cited

U.S. PATENT DOCUMENTS

| | | | | |
|---|---|---|---|---|
| 5,925,203 | A * | 7/1999 | Riddle et al. ............... | 156/89.16 |
| 6,099,753 | A | 8/2000 | Yoshimura et al. | |
| 6,428,913 | B1 | 8/2002 | Yoshihara et al. | |
| 2002/0168513 | A1 | 11/2002 | Hattori et al. | |
| 2004/0061433 | A1 | 4/2004 | Izuno et al. | |
| 2005/0140267 | A1 * | 6/2005 | Maeda et al. ................. | 313/493 |
| 2006/0267042 | A1 * | 11/2006 | Izuno et al. ................... | 257/100 |

FOREIGN PATENT DOCUMENTS

| | | |
|---|---|---|
| EP | 1437776 A1 | 7/2004 |
| JP | 02-228354 | 9/1990 |
| JP | 08-100107 | 4/1996 |
| JP | 63-196044 | 8/1998 |
| JP | 11-236519 | 8/1999 |
| JP | 2002110042 A | 4/2002 |
| JP | 2003-132824 | 5/2003 |
| JP | 2004-059779 | 2/2004 |
| JP | 3553868 | 5/2004 |
| JP | 2005-305367 | 11/2005 |

OTHER PUBLICATIONS

Schmidt, H.K. "Das Sol-Gel-Verfahren", Chemie in unserer Zeit, 2001, vol. 35, No. 3, ISSN 1521-3781, pp. 177-184.
Minutes of the Oral Hearing from the German Patent and Trade Mark Office regarding German Patent Application No. 10 2006 006 820. 3-33, Dec. 20, 2010. (with English translation).

* cited by examiner

*Primary Examiner* — Quoc Hoang
*Assistant Examiner* — Tony Tran
(74) *Attorney, Agent, or Firm* — Bacon & Thomas, PLLC (57) ABSTRACT

An IC chip coating material includes first metal oxide particles; a metal alkoxide; an organic solvent; and second metal oxide particles and/or flat particles of a composite oxide, the second metal oxide particles having a composition identical to or different from that of the first metal oxide particles and also having a mean particle size and/or a shape different from that of the first metal oxide particles. Further, a vacuum fluorescent display device includes an IC chip, wherein the IC chip is at least partially coated by a coating material layer including the first metal oxide particles; a metal forming metal alkoxide; and the second metal oxide particles and/or flat particles of a composite oxide.

11 Claims, 8 Drawing Sheets

IC CHIP COATING MATERIAL AND VACUUM FLUORESCENT DISPLAY DEVICE USING SAME

FIELD OF THE INVENTION

The present invention relates to a vacuum fluorescent display device in which an IC chip is mounted on a vessel; and, more particularly, to a vacuum fluorescent display device in which an IC chip and at least a part of vicinities thereof are coated with an IC chip coating material for a fluorescent display device.

BACKGROUND OF THE INVENTION

As for a fluorescent display device having a chip in glass structure (hereinafter, referred to as CIG structure) in which an IC chip, i.e., integrated circuit devices on a semiconductor substrate, is fixed on a glass anode board serving as a part of an envelope, there is known a device which protects an IC chip from external light or the like with an IC cover formed of, e.g., 426 alloy.

However, in case of using the IC cover, there is a limit in narrowing a gap between a filament and an anode. Particularly, in case of a low voltage operation, it is difficult to narrow an FH (distance between the filament and the anode), thereby making it difficult to attain a high level of brightness.

Further, in case where the IC cover is installed, conductive materials generated during a welding splash process or the like adhere between a bonding wire and its neighboring wire to thereby cause a short-circuit therebetween. As a result, there may be generated an IC malfunction or a display fault. In order to solve the above problems, Japanese Patent No. 3553868 provides a technique for coating an IC chip covered by an IC cover or a bonding wire portion with a coating material.

Figure 9:
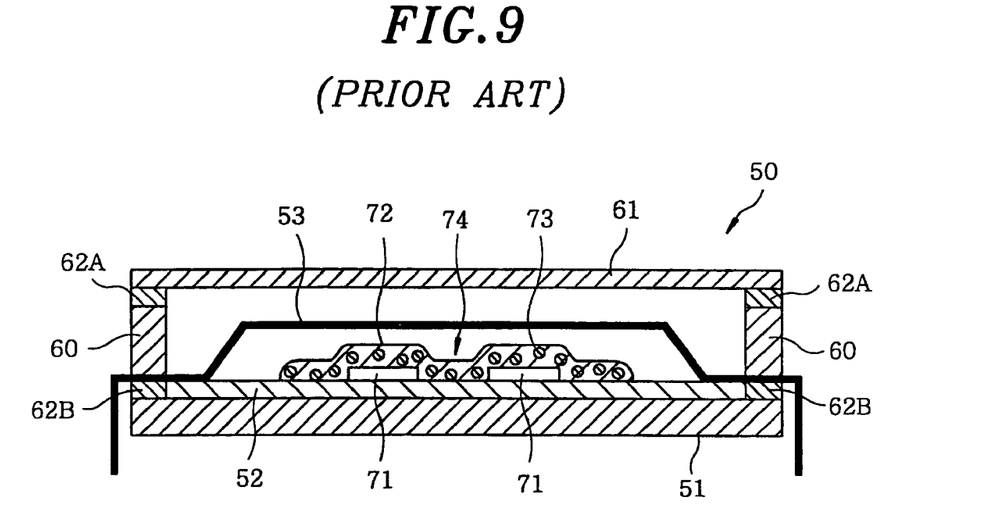
FIG. 9 offers a fragmentary sectional view of principal parts of the conventional fluorescent display device having a CIG structure.

As shown in FIG. 9, in a fluorescent display device 50 disclosed in Japanese Patent No. 3553868, an IC chip 71 is fixed on a substrate 51 by a die bonding paste via a black insulating film 52, and a first electrode on the substrate 51 and a second electrode on the IC chip 71 are connected to each other by a wire. Further, an insulating layer 72 is formed to cover the first and the second electrode and the wire. After a lead frame as a metal element for unifying a filament support 53 or the like is disposed above the IC chip 71, the substrate 51 and glass vessels 60 and 61 are sealed by fritted glasses 62A and 62B, thereby forming an envelope. Furthermore, the second electrode of the IC chip 71 and the wire are coated with a coating material 74 containing insulating particles 73, wherein a mean particle size thereof is smaller than or equal to one third of a pitch between neighboring wires.

In Japanese Patent No. 3553868, the coating material 74 for coating the IC chip and its neighboring portion is obtained by dispersing $Al_2O_3$ serving as insulating particles 73 into a solution where Al alkoxide as a solute is dissolved in alcohol. Here, a mean particle size of $Al_2O_3$ is known to be 1 μm, and a weight ratio of $Al_2O_3$ to Al alkoxide is set to be 0.5. In addition, by heating the coating material 74 under an atmosphere of 480° C., alcohol contents therein are evaporated and, then, an insulating layer 72 of $Al_2O_3$ is formed from an Al alkoxide by a baking process. Since the insulating particles 73 made of $Al_2O_3$ are not shrunk by the heating, the coating material 74 including the insulating layer 72 and the insulating particles 73 is less shrunk than the case when it is exclusively composed of a coating insulating layer during the baking process, thereby reducing a stress applied to the wire. Accordingly, there is disclosed a technique for preventing the wire itself from being cut off or preventing the connection between the wire and the electrode from being cut.

Alternatively, the coating material 74 may be obtained by dispersing $SiO_2$ serving as insulating particles into a solution where polyimide resin as a solute is dissolved in dimethylacetamide. Here, a mean particle size of $SiO_2$ is known to be 5 μm, and a weight ratio of $SiO_2$ to polyimide resin is set to be 1 (that is, a weight ratio of $SiO_2$ to polyimide resin is set to be 1:1). If a heating temperature is lower than 400° C., the coating material 74 has no degassing effect. Therefore, there is disclosed a technique for generating the insulating layer 72 formed of a polyimide film by performing the baking process at a temperature ranging from 400° C. to 500° C. such that the insulating particles 73 of $SiO_2$ will be made to be adhered between wires and between the wire and the black insulating film 52 with the use of the insulating layer 72.

As for a fluorescent display device having the CIG structure in which only parts where bonding wires are connected are coated, there is known a device disclosed in Japanese Patent Laid-open Application No. 2003-132824, for example.

Figure 10:
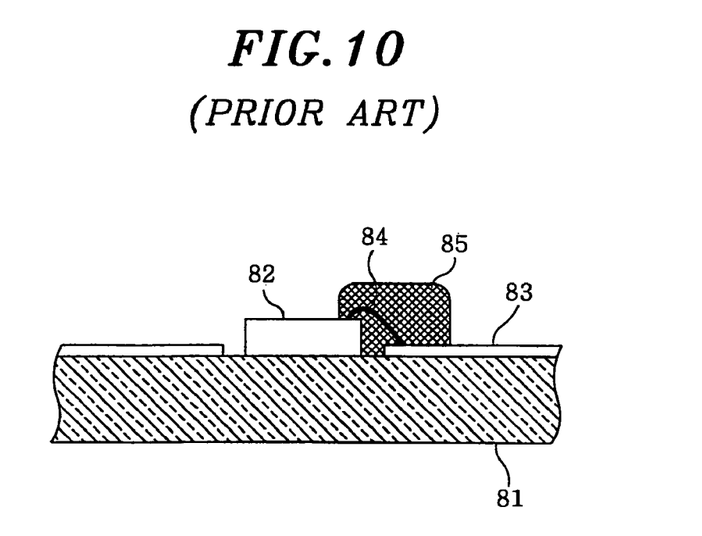
FIG. 10 sets forth a sectional view of an IC chip portion of the conventional fluorescent display device having the CIG structure.

As illustrated in FIG. 10, in the fluorescent display device disclosed in Japanese Patent Laid-open Application No. 2003-132824, an IC chip 82 is mounted on a glass substrate 81 by a die bonding paste, and a wiring 83 made of aluminum or the like is formed thereon. Further, each electrode of the IC chip 82 and the wiring 83 corresponding thereto are connected by a bonding wire 84. And also, the electrodes, to which the bonding wires 84 are connected, of the IC chip 82 on the substrate and the bonding wires 84 connected to such electrodes are coated by a coating material 85.

In the fluorescent display devices having such CIG structure, by coating a whole or a part of a front surface of the IC chip 82 with a coating material, it is possible to overcome a malfunction of the IC chip, which is caused by a short-circuit due to a conductive foreign substance connecting the bonding wire 84 with its neighboring wire.

However, in the fluorescent display device of the aforementioned Japanese Patent No. 3553868, a passageway of a gas generated from the die bonding paste for fixing the IC chip 71 is blocked by the coating material 74. Consequently, an adhesive strength of the coating material 74 deteriorates and the IC chip 71 is separated from the glass substrate 51 in worst cases, thereby deteriorating a performance and a reliability of the fluorescent display device.

Further, in the fluorescent display device of Japanese Patent Laid-open Application No. 2003-132824, in order to solve the aforementioned drawbacks, the coating material 85 for coating the electrodes, to which the bonding wires 84 are connected, of the IC chip 82 on the substrate and the bonding wire 84 connected to the corresponding electrode is provided. As a result, the amount of gas generated is reduced by half and, also, the passageway of the generated gas is secured. However, the gas is still discharged from the coating material 85 at the parts where the bonding wires are connected, and the device will face the same problems as those of Japanese Patent No. 3553868.

The coating material used in the aforementioned Patent documents needs to be baked at a temperature higher than 400° C. to 500° C., which leads to a breakdown of the IC chip. Although a coating material in which polyimide resin is dissolved in a solvent is used, such coating material will shrink significantly while being cured during the drying process or the baking process and may develop a crack or a peeling. Further, since the coating material described above is made of oxide of a single particle, the particles in a bulk formed are cured in a most closely packed structure. As a result, there is a problem that a stress is not relaxed and the crack or the peeling may be developed.

In case the IC chip or the like is coated with a coating material formed of a highly insulating oxide instead of the coating material described above, since most colors of the coating material range from white to dim brown, the coating material is noticeable in the fluorescent display device in which an insulating layer formed of an insulating material such as a lead glass or the like is coated, wherein the lead glass is colored by a paint added with oxide particles of Fe/Cr.

SUMMARY OF THE INVENTION

It is, therefore, an object of the present invention to provide a high-quality fluorescent display device having a highly reliable CIG structure by coating an IC chip fixed by a die bonding paste hardly generating gas and at least a part of its neighboring area.

In accordance with a preferred embodiment of the present invention, there is provided an IC chip coating material including: first metal oxide particles; a metal alkoxide; an organic solvent; and second metal oxide particles and/or flat particles of a composite oxide, the second metal oxide particles having a composition identical to or different from that of the first metal oxide particles and also having a mean particle size and/or a shape different from that of the first metal oxide particles.

In accordance with another preferred embodiment of the present invention, there is provided a fluorescent display device including an IC chip, wherein the IC chip is at least partially coated by a coating material layer including first metal oxide particles; a metal forming metal alkoxide; and second metal oxide particles and/or flat particles of a composite oxide, the second metal oxide particles having a composition identical to or different from that of the first metal oxide particles and also having a mean particle size and/or a shape different from that of the first metal oxide particles.

BRIEF DESCRIPTION OF THE DRAWINGS

The above and other objects and features of the present invention will become apparent from the following description of preferred embodiments, given in conjunction with the accompanying drawings, in which.

DETAILED DESCRIPTION OF THE PREFERRED EMBODIMENT

Hereinafter, preferred embodiments of the present invention will be described in detail with reference to the accompanying drawings.

First of all, a vacuum fluorescent display device of the present invention will be described with reference to FIGS. 1 to 5. A vacuum fluorescent display device 1 of a CIG structure in accordance with the present invention is an anode substrate 11 in which a wiring conductor 13 of the fluorescent display device 1 and an anode 12 containing an anode conductor 14 and a phosphor layer 15 are arranged. The anode substrate 11 is generally made of a glass substrate and an insulating layer 26 is formed on an approximately entire surface thereof. Moreover, an IC chip 16 is fixed to an end portion of the anode substrate 11 via a die bonding layer 23. The IC chip 16 is connected to a terminal 17 connected to an end portion of the wiring conductor 13 by a bonding wire 18. Further, a filament-shaped cathode 21 separated from a grid 20 by a predetermined regular distance is tightly stretched on the anode substrate 11, while the grid 20 separated from the anode 12 by a predetermined regular distance is arranged to face the anode 12.

Figure 1:
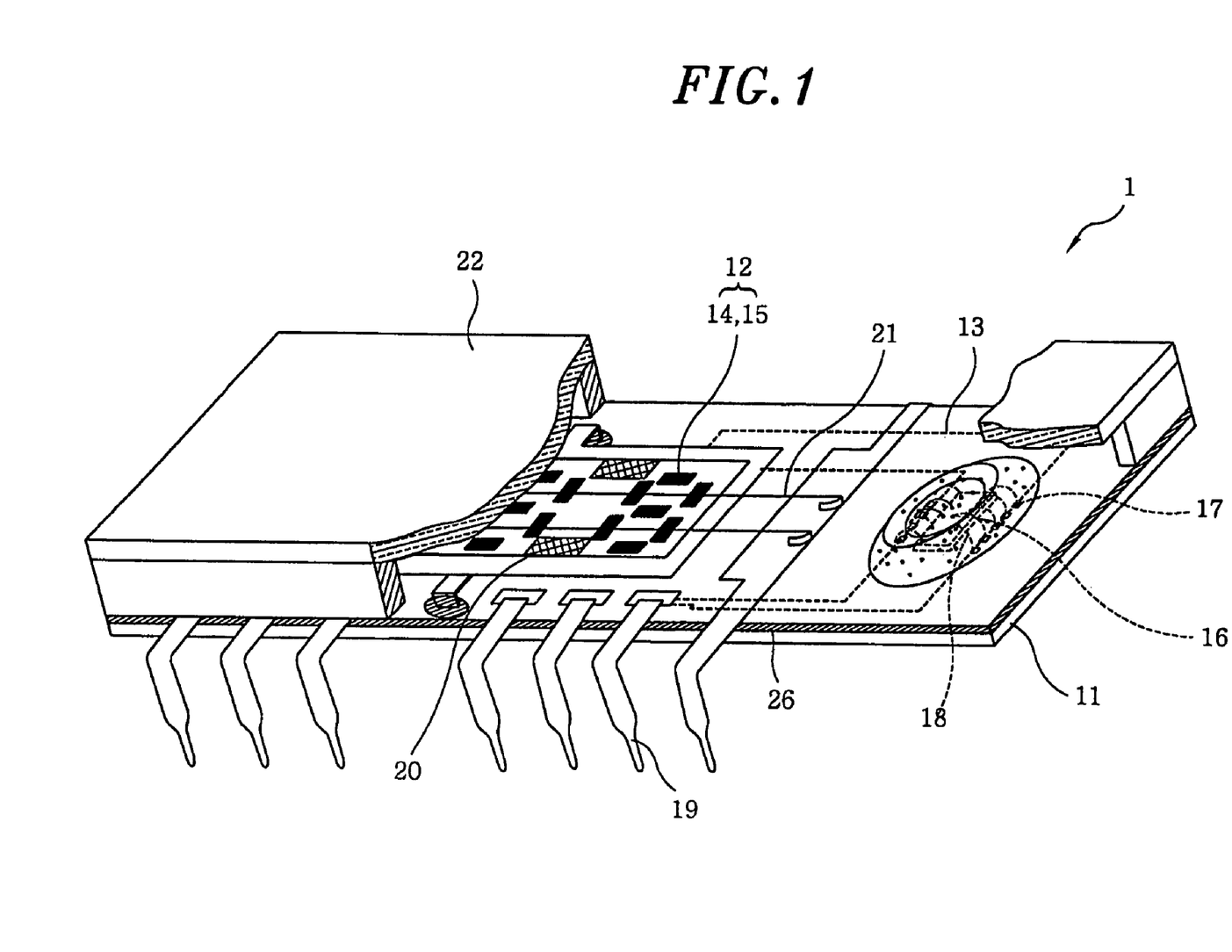
FIG. 1 is a partially cutaway perspective view of a fluorescent display device having a CIG structure in accordance with the present invention.

The anode 12 and the grid 20 are connected to the IC chip 16 by the wiring conductor 13 and also to an external lead 19 serving as an input terminal of the IC chip 16. Further, the die-bonded IC chip 16 and its neighboring area are coated with an IC chip coating material 25A for a fluorescent display device. Furthermore, a box-shaped vacuum vessel 22 is provided such that it covers an electrode on the anode substrate 11, wherein the vacuum vessel 22 is sealed by a sealing member whose main component is a fritted glass having a low melting point.

Figure 2:
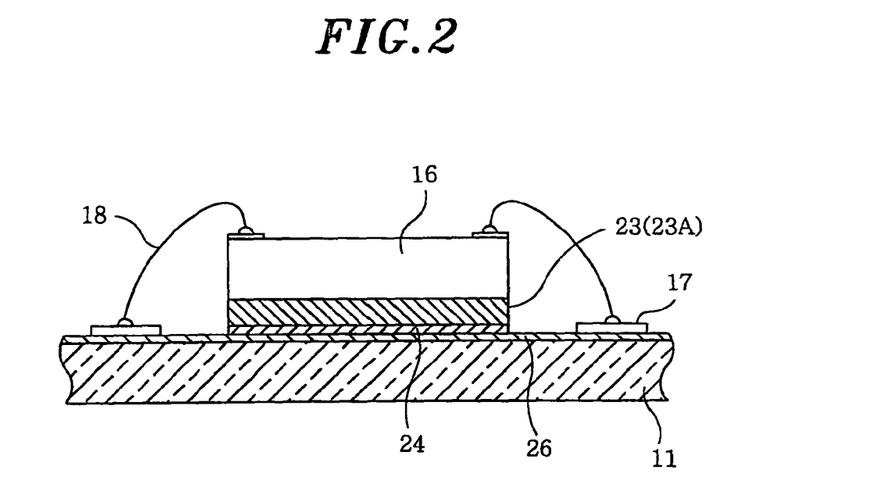
FIG. 2 shows a fragmentary sectional view of an IC chip portion of FIG. 1.

The following is a detailed description of the neighboring area of the IC chip 16. As shown in FIG. 2, in order to bond the IC chip 16 to the anode substrate 11, the die bonding paste 23A needs to be adhered onto the anode substrate 11 or onto a backside of the IC chip 16 and, then, the IC chip is mounted on the substrate at a position to be fixed. Next, a die bonding paste 23A is dissolved with the heat, thereby fixing the IC chip to the substrate. In other words, the IC chip 16 is bonded to the anode substrate 11 via the die bonding layer 23.

Here, the die bonding paste 23A used in this embodiment will be described. The die bonding paste 23A is formed of a vehicle containing fine conductive particles and an organic metal. As for the fine conductive particles, flake-shaped Ag particles whose particle size ranges from 0.1 µm to 50 µm are used. An organic metal compound containing metal atoms such as Ti, Al, Si, In, Zr or the like is generally liquid or soluble to a solvent. Also, it can be soaked to thereby become a paste. Further, as for the organic metal compound, it is known to form a metal oxide by using a pyrolysis reaction. Thus, the Ag particles serving as a functional material in the paste can be fixed to the substrate during the baking process.

Hereinafter, a specific compound of the die bonding paste will be described.

Organic titanium (TOG): 30 g
Conductive particles (Ag particles): 70 g
Organic solvent of low boiling point (tridecyl alcohol, terpineol): proper quantity Since the tridecyl alcohol and terpineol serving as the organic solvent have comparatively low boiling points, respectively, a very little amount of unnecessary gas is discharged during the formation of the coating material. Moreover, a very little amount of unnecessary gas is discharged after the formation of the fluorescent display device is completed.

Figure 3:
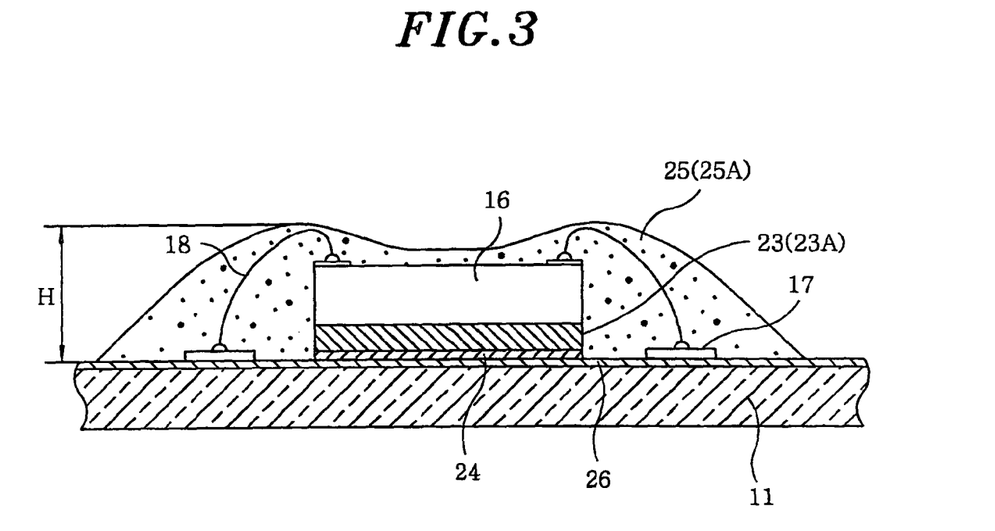
FIG. 3 provides a fragmentary sectional view depicting a state where an IC chip coating material for a fluorescent display device is coated on the IC chip and its neighboring area after die-bonding the IC chip.

As depicted in FIG. 3, after the IC chip 16 is die-bonded, in order to coat the IC chip 16 and the bonding wire 18 installed on the substrate, the coating material layer 25 made of the IC chip coating material 25A for a fluorescent display device is formed exactly in a same way as the fixed IC chip 16 and its neighboring area are coated by using a dispenser.

Hereinafter, components of the IC chip coating material for a fluorescent display device used in this embodiment will be described in detail. The IC chip coating material of this embodiment is a paste made by mixing fine particles of black tone metal oxide including Fe, Cr and/or Mn as a main component thereof and for coating the anode substrate 11 (or white tone the metal oxide may include $Al_2O_3$ as a main component thereof in case the insulating layer 26 is white tone); an $Al_2O_3$-based metal alkoxide (hereinafter, referred to as an alumina sol solution) serving as a metal alkoxide added as a fixing material; and an organic solvent (having a boiling point ranging from about 100° C. to 250° C. and non-volatile at room temperature) for making the IC chip coating material 25A in a form of a paste. Also, mixed into the paste in addition to the those described above are fine particles of another metal oxide having a composition identical to or different from that of the above-described metal oxide and also having a mean particle sizes and/or a shape different from that of the above-described metal oxide; and/or flat fine particles of a highly insulating composite oxide such as mica or the like.

In case black oxide pigment of Fe, Cr and/or Mn is used as the fine metal oxide particles and fine Fe, Cr and/or Mn oxide particles of a mean particle size different from that of the fine metal oxide particles are used, the paste assumes black appearance. On the other hand, in case white oxide pigment of Al is used as the fine metal oxide particles and fine Al oxide particles of a mean particles size different from that of the fine metal oxide particles are used, the paste assumes white appearance.

Moreover, a Si oxide can be used as a white metal oxide pigment while the Si oxide is used as another fine metal oxide particles having a different mean particle size. Further, depending on the purpose of using the fluorescent display device 1, a contrast can be expressly emphasized intentionally by using the white tone fine metal oxide particles including $Al_2O_3$ as a main component thereof in case the insulating layer 26 is black, and the black tone fine metal oxide particles including Fe, Cr and/or Mn as a main component thereof in case the white insulating layer 26 is white.

In order to relax a stress caused by a drying process during the formation of the coating material layer 25 generated by coating a corresponding material, the IC chip coating material 25A includes, in addition to first fine metal oxide particles, second fine metal oxide particles and/or flat fine particles of a highly insulating composite oxide, the second metal oxide particles having a composition identical to or different from that of the first metal oxide particles and also having a mean particle size and/or a shape different from that of the first metal oxide particles. Further, a mean particle size ratio of the first fine metal oxide particles to the second fine metal oxide particles and/or flat fine particles of the highly insulating composite oxide is preferably set to be 1:5 or more (for example, in case a mean particle size of the first fine metal oxide particles is about 3.5 µm, that of the second fine metal oxide particles and/or the flat fine particles of the highly insulating composite oxide is about 25 µm).

Moreover, since the dispenser may be blocked by the fine particles used herein during the coating process, it is preferable to restrict a mean particle size of the added fine particles to be 1/10 of an inner diameter of the dispenser used for the coating process (e.g., if the inner diameter of the dispenser ranges from 0.3 mm to 0.5 mm, the particle size of the fine particles is preferably from 30 µm to 50 µm).

Besides, in case the flat fine particles of the highly insulating composite oxide are added, the added amount is preferably about 20% of a total amount of the fine metal oxide particles and the fine particles of the highly insulating composite oxide in the IC chip coating material 25A. Further, the flat fine particles of the highly insulating composite oxide is not limited to the aforementioned mica as long as they are insulating particles of a mean particle size and/or a shape different from that of the added fine metal oxide particles and do not affect the performance of the IC chip coating material 25A.

As for the metal alkoxide (having at least one M-O—C combination, M being a metal) added as a fixing material, there are $TiO_2$-based metal alkoxide, $SiO_2$-based metal alkoxide and the like in addition to the alumina sol solution. Since, however, an insulating characteristic thereof increases in the order of $TiO_2$, $SiO_2$ and $Al_2O_3$, in case of $TiO_2$-based metal alkoxide, if there is a more stable oxide (alumina or the like) than the $TiO_2$-based metal alkoxide, it is deoxidized during a heating process of the fluorescent display device 1, thereby decreasing its original resistance. In such point of view, it is preferable to use $Al_2O_3$-based metal alkoxide.

As for the organic solvent for making the IC chip coating material 25A a paste, it is preferable to use an organic solvent whose boiling point ranges from about 100° C. to 250° C. This is because if the boiling point is low while using the dispenser, the organic solvent becomes dry inside a cylinder or near a nozzle and thus blocks the dispenser. Further, it is difficult to achieve a proper coating state. On the contrary, if the boiling point is high, a vacuum level deteriorates or it will have ill effects on an emission in the manufacturing process of the fluorescent display device. As a result, the boiling point of the organic solvent used herein preferably ranges from about 100° C. to 250° C.

Although a film thickness obtained by coating the IC chip 16 and its neighboring area with the IC chip coating material 25A configured as described above varies depending on coating areas, it is greater than a thickness of the IC chip 16 by 50 to 150 µm on the IC chip 16 (the thickness of the IC chip 16 being about 0.2 mm to 0.3 mm). Further, as shown in FIG. 3, the film thickness of the IC chip coating material 25A near a top of the wire is controlled within the range of 150 μm±100 μm.

In case the IC chip coating material paste 25A is coated and then dried at about 100° C. to 250° C., an expansion coefficient ranges as follows:

glass substrate (soda lime glass): about $90 \times 10^{-7}$/° C.;
IC chip (Si wafer): about $40 \times 10^{-7}$/° C.; and
wire: about $200 \times 10^{-7}$/° C., wherein a thermal expansion coefficient of the IC chip coating material 25A is preferably of an intermediate value between that of the IC chip 16 and that of the glass substrate.

Figure 4:
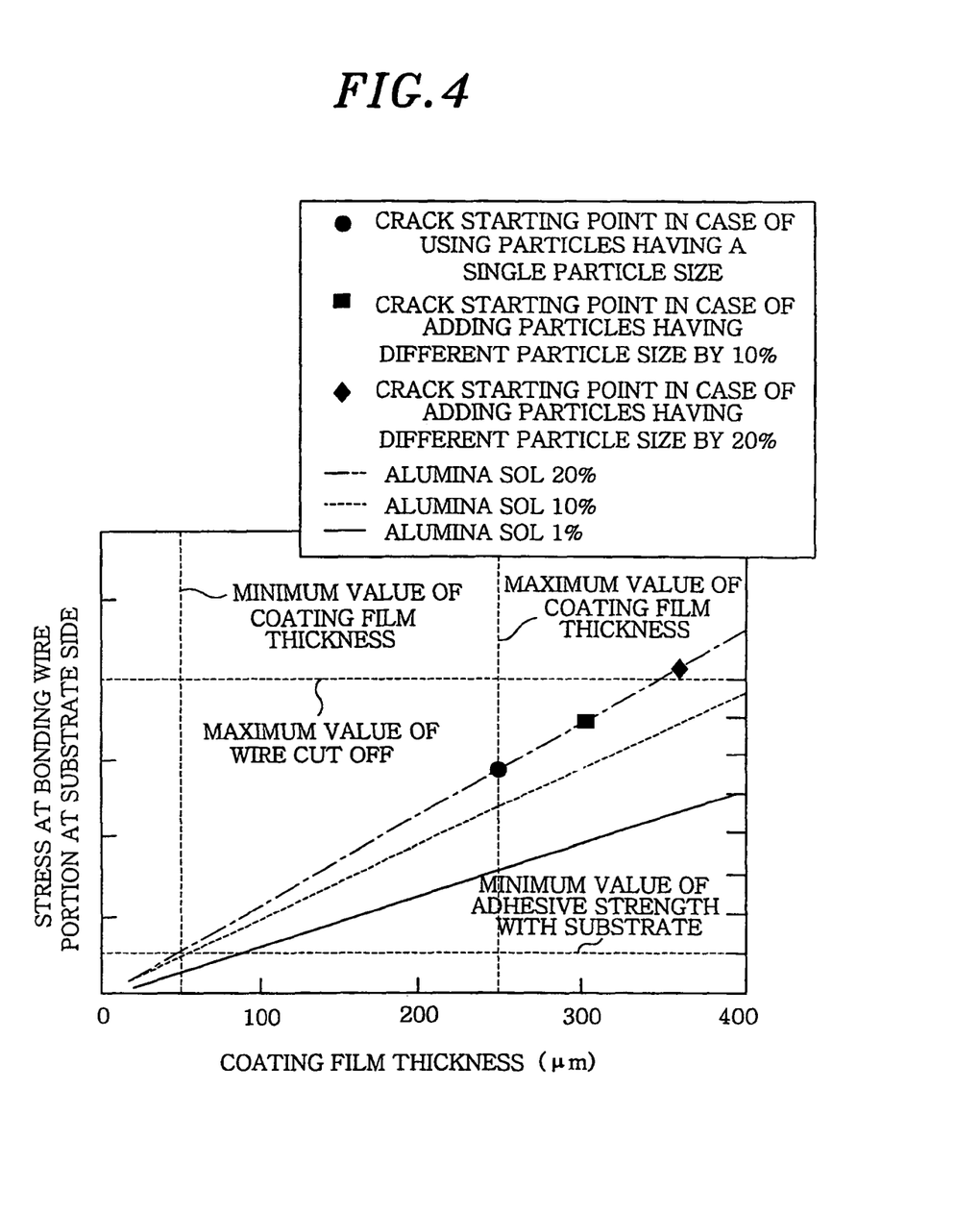
FIG. 4 illustrates a graph showing an exemplary test data on an IC chip coating material for use in the fluorescent display device in accordance with the present invention.

Further, as illustrated in FIG. 4, since the alumina sol serves as a fixing material, as the amount of the fixing material decreases, a stress generated becomes small and a stress inclination relative to a coating film thickness becomes small, too.

Along with the reduction of the alumina sol, the adhesive strength for supporting the IC chip coating material 25A on the anode substrate 11 is reduced. Furthermore, in case the amount of alumina sol is extremely large, it does not become a paste. In case an alumina powder added to the alumina sol solution has a single particle size and the coating film becomes thick, the stress cannot be relaxed so that cracks are developed. However, by adding particles of a different particle size, the stress can be relaxed by fine cracks generated between two particles.

In other words, it is preferable to reduce the amount of alumina sol solution added up to a level capable of reducing the stress with a proper adhesive strength and then add particles of a different particle size.

Figure 5A:
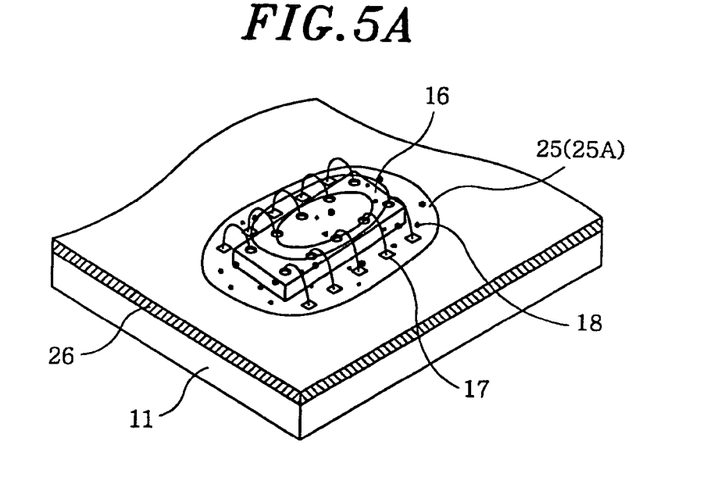
FIG. 5A provides a schematic diagram of an example in which the IC chip coating material in accordance with the present invention is applied to the IC chip and its neighboring area.
Figure 5B:
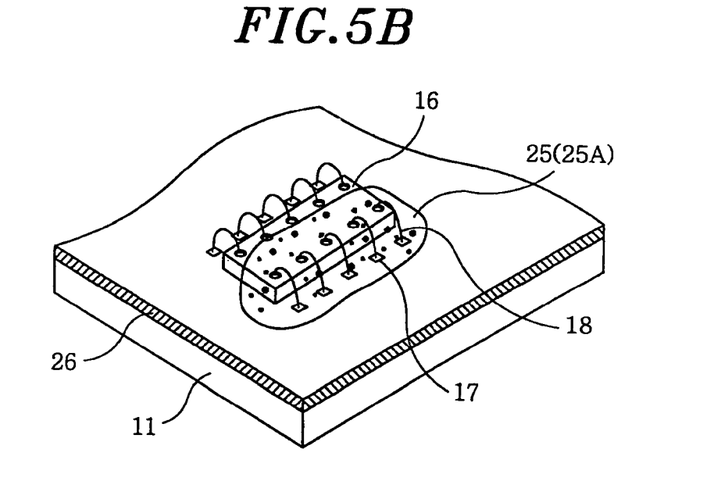
FIG. 5B presents a schematic diagram of an example in which the IC chip coating material in accordance with the present invention is applied to a part of the IC chip and a part of a bonding wire.
Figure 5C:
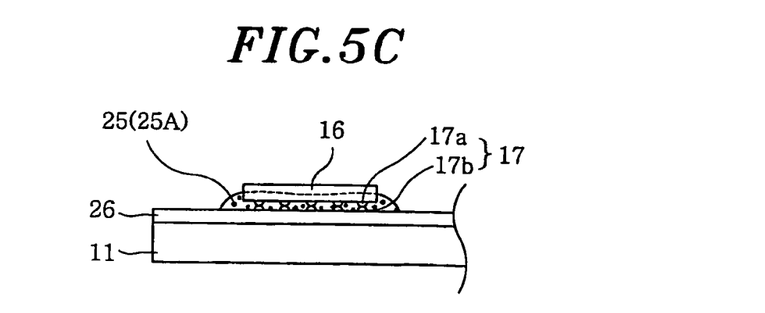
FIG. 5C represents a schematic diagram of an example in which the IC chip coating material in accordance with the present invention is applied to a part of the IC chip conducted by connecting bumps.

As for the coating method of the IC chip coating material, as illustrated in FIGS. 3 and 5A, it is preferable that the IC chip and its neighboring area are entirely coated, but the coating method is not limited thereto. In other words, even if the IC chip coating material 25A is partially coated over only the portions where the coating process is required on the IC chip 16 and its neighboring area, the same effects of the coating method described above can be achieved. For example, as shown in FIG. 5B, it is possible to coat partially one side of the IC chip 16. In addition, as depicted in FIG. 5C, in case the fluorescent display device has connecting bumps 17a and 17b formed to face the substrate 11 and the IC chip 16, respectively, the connecting portion thereof can be exclusively coated by the IC chip coating material 25A, as illustrated.

And also, in case the IC chip is entirely coated, for securing a stability against an inferior insulation, it is preferable to use the IC chip coating material 25A using black fine metal oxide particles including Fe, Cr and/or Mn as a main component thereof, which have a low level of a thermal stress than the IC chip coating material 25A using white fine metal oxide particles including $Al_2O_3$ as a main component thereof.

First Preferred Embodiment

Hereinafter, the fluorescent display device 1 having the CIG structure in accordance with the present invention will be described in detail based on the manufacturing process. The present invention is not limited to following embodiments, and various changes and modification may be made without departing from the scope of the invention.

First of all, the anode substrate 11 on the inner surface of which the wiring conductor 13 and the anode conductor 14 are patterned is provided. Further, by adhering the phosphor layer 15 on a top surface of the anode conductor 14, the anode 12 is formed. Furthermore, the grid 20 is disposed above the anode 12 at a position upwardly separated by a predetermined regular distance therefrom, and the filament-shaped cathode 21 is tightly installed above the grid 20 at a position upwardly separated by a predetermined regular distance therefrom.

Moreover, the die bonding paste 23A is coated on the grounded electrode 24 provided at an end portion of the anode plate 11 provided with the phosphor layer 15 or directly on a top surface of the plate 11. Next, as shown in FIG. 2, the IC chip 16 is mounted on the anode plate 11 and then dried at about 200° C. Further, the bonding wire 18 connects the IC chip 16 to the terminal 17 connected to the anode 12 and the grid 20 by the wiring conductor 13 while another bonding wire connects the IC chip 16 to the terminal 17 connected to the external lead 19 by the wiring conductor 13.

The die bonding paste used herein is obtained by mixing organic titanium (TOG) of 25 g, fine conductive particles (Ag particles) of 75 g and a predetermined proper quantity of a solvent (terpineol).

Further, after the IC chip 16 is die-bonded, as shown in FIG. 3, the IC chip 16 on the anode plate 11 and its neighboring area are coated with the IC chip coating material 25A.

The IC chip coating material 25A used herein is a paste obtained by mixing following materials:

(1) black fine metal oxide particles including Fe, Cr and Mn as a main component thereof ($Fe_2O_3$: about 40%, $Cr_2O_3$: about 45% and $MnO_2$: about 15%), whose particle size is about 3.5 μm: 55 g;

(2) flat fine particles of a composite oxide, i.e., mica whose particle size is about 25 μm: 10 g;

(3) alumina sol as a fixing material: 10 g; and (4) ethylene glycol as a solvent: 25 g.

After the coating process is completed, a drying process is performed under an atmospheric atmosphere whose peak temperature is set to range from about 100° C. to 250° C. At this time, among materials mixed in the IC chip coating material 25A, a solvent for dispersing alumina powder contained in the alumina sol solution used as a fixing material into a solution and an ethylene glycol serving as an organic solvent for making the IC chip coating material 25A a paste are evaporated. As a result, fine coloring metal oxide particles, mica serving as the flat fine particles of the composite oxide and metal oxide particles (alumina) serving as a fixing material remain as the IC chip coating material.

Due to the mixture of particles of a different particle size in the coating material layer 25, it is possible to relax the stress from the thermal expansion caused during the drying process and further to prevent a breakdown of the wire or a crack in the IC chip coating material 25A. Further, since gas components generated from the die bonding paste 23A are evaporated together with an evaporating element in the IC chip coating material 25A during the drying process, gas is hardly generated from the die bonding layer 23 after the formation of the coating material layer 25 is completed. Moreover, the gas is hardly generated during the manufacturing process of the fluorescent display device, which is performed at a temperature higher than or equal to 400° C.

After the IC chip coating material 25A is dried, a box-shaped container 22 is sealed at about 480° C. to be fixed on the anode plate 11. Next, by exhausting gas in the fluorescent display device through a gas exhaust line (not illustrated), a high vacuum state is achieved. Thereafter, the gas exhaust line is sealed, thereby completing the fluorescent display device 1.

In the first preferred embodiment, when the IC chip coating material 25A made of the aforementioned materials (1) to (4) is coated, a composition thereof (in case of a total amount being 100 wt %) is as follows:

(1)+(2): 60 to 70 wt % (added at a ratio of (1):(2)=4:1);
(3): 5 to 20 wt %; and
(4): 10 to 35 wt %.

Meanwhile, a composition of the coating material layer 25 formed through the drying process is as follows:
(1)+(2): 97 to 99 wt %;
(3): 1 to 3 wt %; and
(4): 0 wt %.

Accordingly, it can be understood that a solvent for dispersing alumina powder contained in the alumina sol solution used as a fixing material into a solution and an organic solvent for making the IC chip coating material 25A a paste are evaporated during the drying process.

Figure 6:
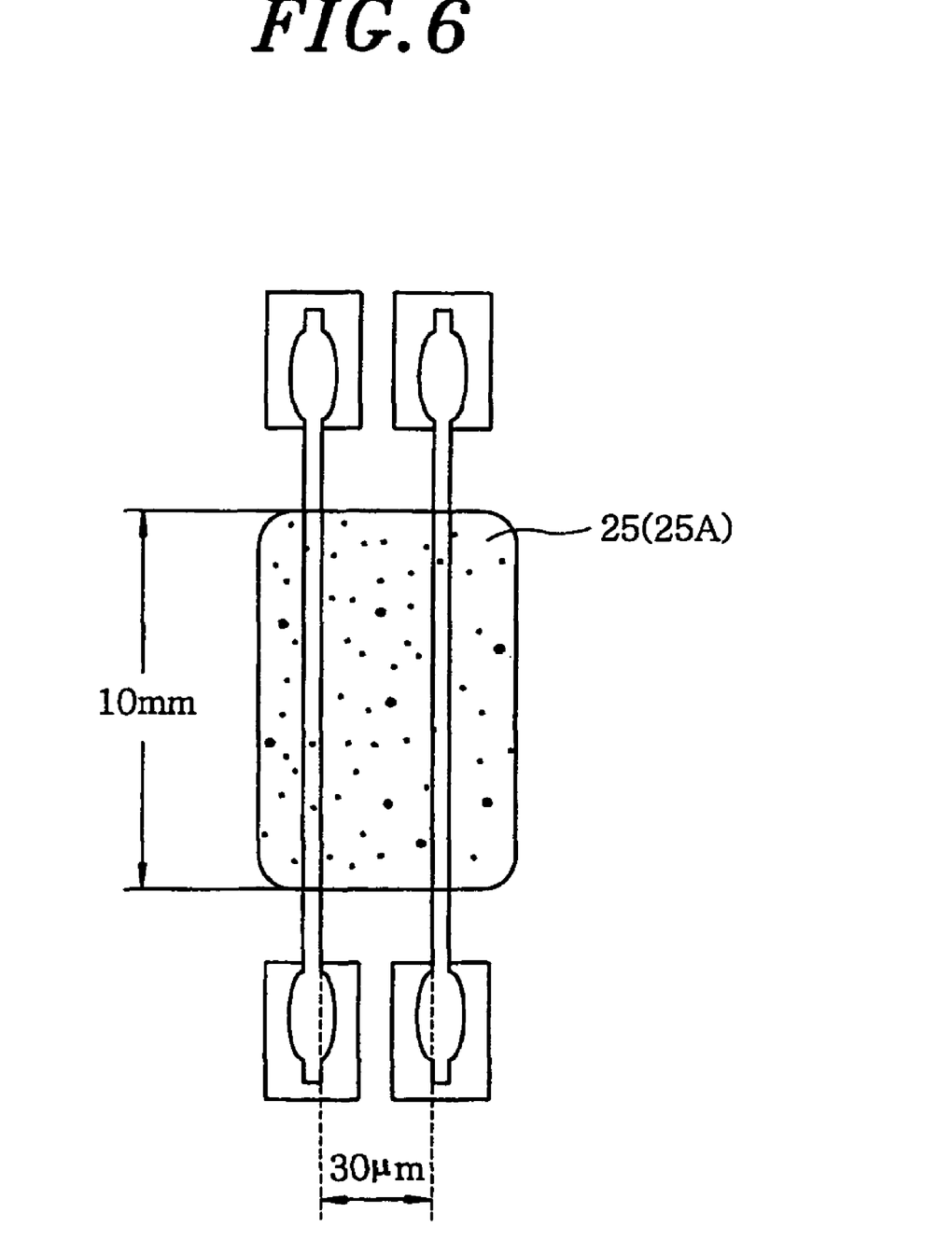
FIG. 6 presents a schematic diagram of a test example for testing an insulating level of the IC chip coating material for use in the fluorescent display device in accordance with the present invention.

As shown in FIG. 6, after coating another IC chip coating material 25B of the present invention and the conventional IC chip coating material including alumina on Al-wirings having a 30 μm gap (on an area within a distance of 10 mm that is coated with the IC chip coating material (hereinafter, refer to as "facing distance")), the drying processes of the present IC chip coating material and of the conventional IC chip coating material were performed under the atmosphere whose peak temperatures were set to range from about 100° C. to 250° C. and to be about 480° C., respectively. The IC chip coating material 25B is identical to IC chip coating material 25A, excepting that the black fine metal oxide particles including Fe, Cr and Mn is replaced with black fine metal oxide particles including Fe and Cr as a main component thereof ($Fe_2O_3$: about 53%, $Cr_2O_3$: about 47%) Further, a leak test-between wires was performed by applying a voltage of 100 V between the wirings having a 30 μm gap (facing distance being about 10 mm) in a vacuum container.

As a result, the IC chip coating material 25B of the present invention has been found to have a resistance in the order of $10^4$ MΩ to $10^5$ MΩ range, which is substantially same as that in the order of $10^5$ MΩ range of the conventional coating material including alumina as a main component thereof. This indicates that a current showing an insulating level between parallel wires of the IC chip ranges from 0.5 μA to 1.0 μA, which falls within a reference standard range required by the standard (the standard current level flowing between the wires is about 1 μA when a voltage of 100 V is applied).

Figure 7:
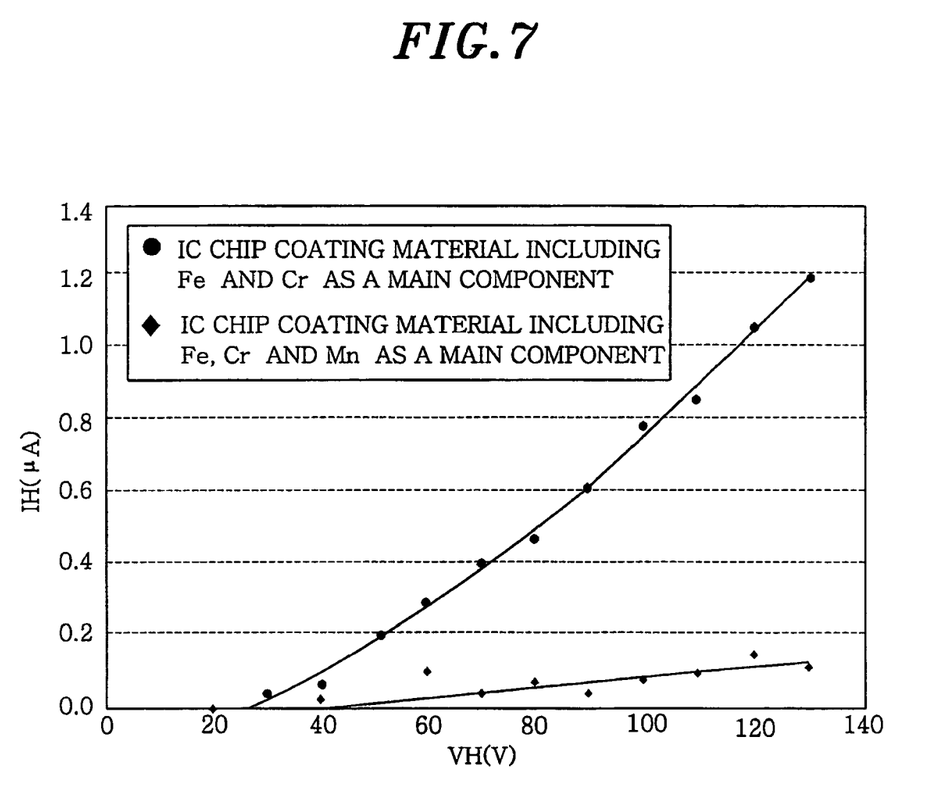
FIG. 7 represents a graph showing a test result of VI characteristics of a IC chip coating material including Fe, Cr and Mn as a main component thereof and another IC chip coating material including Fe and Cr as a main component.
Figure 8:
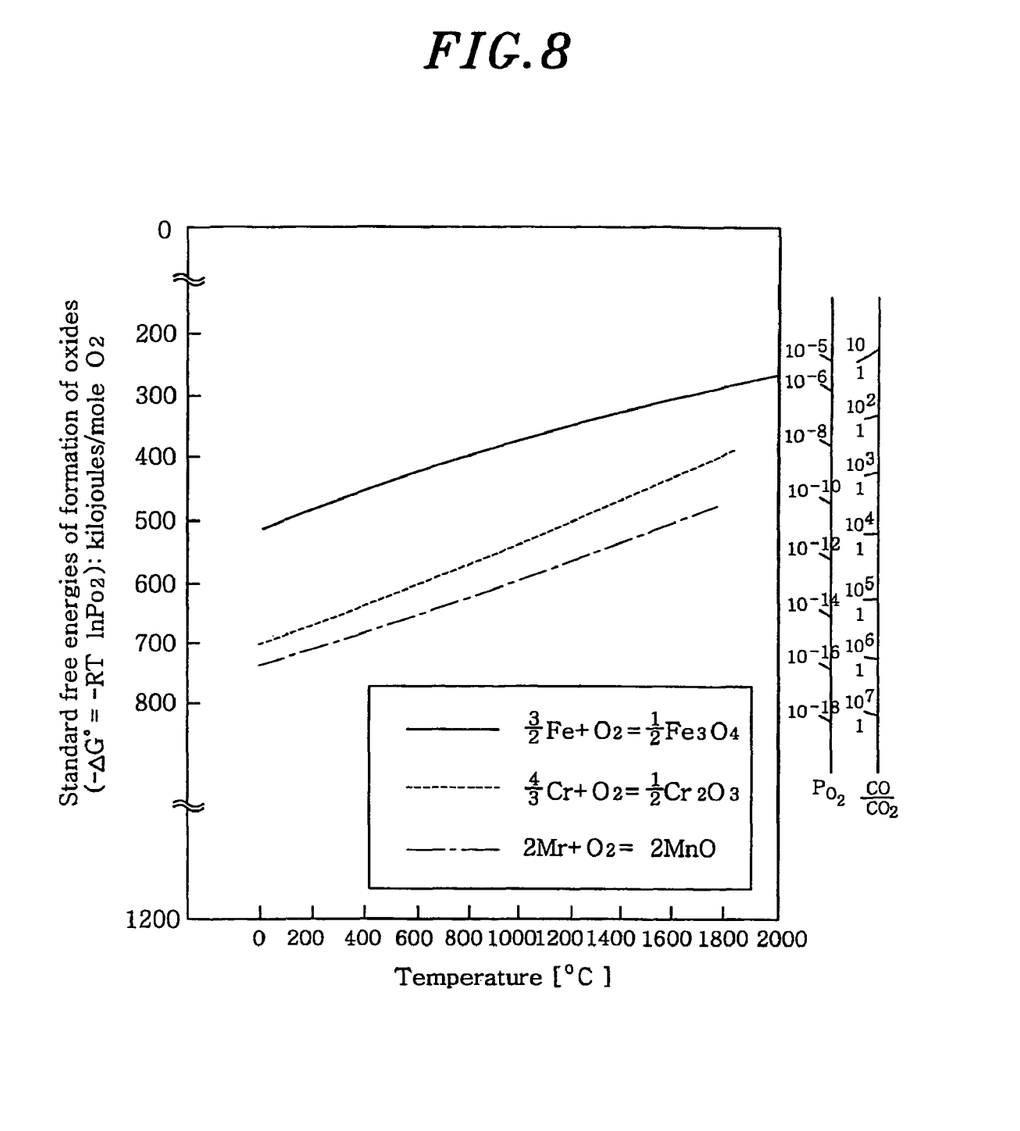
FIG. 8 depicts a graph illustrating an order of stability in an oxidation/deoxidation of metal oxide particles for use in the present invention.

The IC chip coating materials 25A and 25B were applied to the Al-wirings as in the test setup of FIG. 6 (i.e., with the wiring gap of 30 μm and the facing distance of 10 mm). Further, as shown in FIG. 7, IV characteristics between the Al-wirings were performed by applying a voltage ranging from about 0 V to 130 V. From the result, it can be seen that in case of using the IC chip coating material 25B without having Mn, the current begins to increase at critical voltage of 20 V and continues to rise from about 0.3 μA to 1.2 μA as the voltage increases across the medium voltage range from about 60 V to 130 V. On the other hand, in case of the IC chip coating material 25A including Mn that is more stable against oxidation and deoxidation compared to Fe and Cr as shown in FIG. 8, the current is smaller than or equal to 0.2 μA even in the medium voltage range as shown in FIG. 7, which is within the reference standard value.

In the fluorescent display device 1 described above, since a low boiling point solvent is evaporated during the drying process, gas is hardly generated from the die bonding layer 23 after the formation of the coating material layer 25 is completed. Accordingly, the IC chip 16 and its neighboring area can be coated with the IC chip coating material 25A. As a result, it is possible to prevent a short-circuit caused by the conductive foreign substances or the like or defects (a false operation caused by external light and a scattering of Ba arranged directly below a filament-shaped cathode) developed at an exposed portion of the IC chip 16.

Moreover, in an adhering process of the IC chip coating material 25A coated on the IC chip 16, it is preferable to set a drying temperature preferably to range from about 100° C. to 250° C. Consequently, an operating cost can be reduced and the coating material layer 25 can be formed without applying any unnecessary load to the IC chip.

Furthermore, by adding black metal oxide including coloring Fe, Cr and/or Mn as a main component thereof to the IC chip coating material 25A, a color tone similar to that of the black insulating layer 26 can be obtained, thereby making it possible to provide a fluorescent display device having no contrasting color tone difference.

By mixing, in addition to the fine coloring metal oxide particles, fine metal oxide particles having a composition identical to or different from that of the aforementioned fine metal oxide particles and also of a mean particle size and/or a shape different from that of the aforementioned fine metal oxide particles; and/or flat fine particles of the highly insulating composite oxide such as mica or the like, the IC chip coating material 25A can have a reduced elasticity and a stress due to a thermal expansion during the drying process can be reduced, thereby making it possible to prevent cracks of the coating material layer 25.

Besides, by adding Mn-based oxide as black fine metal oxide particles to the IC chip coating material 25A, it is possible to minimize the leak current even in a medium driving voltage range in comparison to the IC chip coating material for the conventional fluorescent display device.

Second Preferred Embodiment

In accordance with a second preferred embodiment, instead of the IC chip coating material used in the first preferred embodiment, there is used an IC chip coating material for a fluorescent display device manufactured based on following compositions. Also, a fluorescent display device is manufactured by using a method identical to that of the first preferred embodiment except the IC chip coating material. Even in case of using the IC chip coating material manufactured based on the following compositions, the same effects as those of the first preferred embodiment can be achieved:
(1) fine Al oxide particles including Al as a main component thereof, whose particle size is about 0.3 μm: 55 g,
(2) flat fine particles of a composite oxide, i.e., mica whose particle size is about 25 μm: 15 g,
(3) alumina sol: 10 g, and
(4) ethylene glycol: 20 g.

Third Preferred Embodiment

In accordance with a third preferred embodiment, instead of the IC chip coating material used in the first preferred embodiment, there is used an IC chip coating material manufactured based on following compositions. Also, a fluorescent display device is manufactured by using a method identical to that of the first preferred embodiment except the IC chip coating material. Even in case of using the IC chip coating material manufactured based on the following compositions, the same effects as those of the first preferred embodiment can be achieved:
(1) fine Al oxide particles including Al as a main component thereof, whose particle size is about 0.3 μm: 50 g,
(2) fine Al oxide particles including Al as a main component thereof, whose particle size is about 5 μm: 20 g
(3) TOG: 15 g, and
(4) ethylene glycol: 15 g.

Fourth Preferred Embodiment

In accordance with a fourth preferred embodiment, instead of the IC chip coating material used in the first preferred embodiment, there is used an IC chip coating material manufactured based on following compositions. Also, a fluorescent display device is manufactured by using a method identical to that of the first preferred embodiment except the IC chip coating material. Even in case of using the IC chip coating material manufactured based on the following compositions, the same effects as those of the first preferred embodiment can be achieved:

(1) black fine metal oxide particles including Fe, Cr, and/or Mn as a main component thereof, whose particle size is about 3.5 µm: 50 g, (2) black fine metal oxide particles including Fe, Cr, and/or Mn as a main component thereof, whose particle size is about 25 µm: 10 g, (3) alumina sol: 10 g, and (4) ethylene glycol: 30 g.

Fifth Preferred Embodiment

In accordance with a fifth preferred embodiment, instead of the IC chip coating material used in the first preferred embodiment, there is used an IC chip coating material manufactured based on following compositions. Also, a fluorescent display device is manufactured by using a method identical to that of the first preferred embodiment except the IC chip coating material. Even in case of using the IC chip coating material manufactured based on the following compositions, the same effects as those of the first preferred embodiment can be achieved:

(1) black fine metal oxide particles including Fe, Cr, and/or Mn as a main component thereof, whose particle size is about 3.5 µm: 40 g, (2) black fine metal oxide particles including Fe, Cr, and/or Mn as a main component thereof, whose particle size is about 20 µm: 20 g+fine composite oxide particles whose particle size is about 25 µm: 10 g, (3) alumina sol: 10 g, and (4) ethylene glycol: 20 g.

Sixth Preferred Embodiment

In accordance with a sixth preferred embodiment, instead of the IC chip coating material used in the first preferred embodiment, there is used an IC chip coating material manufactured based on following compositions. And, also, a fluorescent display device is manufactured by using a method identical to that of the first preferred embodiment except the IC chip coating material. Even in case of using the IC chip coating material manufactured based on the following compositions, the same effects as those of the first preferred embodiment can be achieved:

(1) black fine metal oxide particles including Fe, Cr, and/or Mn as a main component, whose particle size is about 3.5 µm: 53 g, (2) flat fine particles of a composite oxide, i.e., mica whose particle size is about 25 µm: 10 g, (3) alumina sol: 10 g, and (4) octanediol: 22 g+dimethylformamide: 5 g.

In accordance with an IC chip coating material of the present invention, since metal oxides of a mean particle size and/or a shape different from that of the added fine metal oxide particles are mixed, the coating material is of a reduced elasticity and a stress due to a thermal expansion caused during the drying process is also reduced. Further, if the metal oxide particles are of the same composition, the effects are further enhanced. Furthermore, if flat fine particles of the composite oxide are mixed with the metal oxide particles, the effects are much further enhanced.

A process for coating and adhering the IC chip coating material to make a coating material layer is completed only by the drying process performed at about 100° C. to 250° C. Accordingly, an operating cost can be reduced and, further, the coating material layer can be formed without applying an unnecessary load to the IC chip. In addition, in case of the coating material layer, after the manufacturing process of the fluorescent display device is performed at a temperature higher than 400° C., the metal alkoxide is decomposed and a solid content is exclusively coated as the coating material layer. Consequently, it is possible to protect the coated portion from the short-circuit in the IC chip due to the conductive foreign substances or the like or defects generated at an exposed portion of the IC chip (a false operation caused by external light and electrons emitted from a filament and effects of Ba scattered from the filament).

Besides, by adding black metal oxide particles including coloring Fe, Cr and/or Mn as a main component thereof to the coating material layer, a color tone similar to that of a black insulating layer can be obtained, thereby making it possible to provide a fluorescent display device having a very little color tone difference. Furthermore, by adding white metal oxide particles including coloring Al to the coating material layer, a color tone similar to that of a white insulating layer can be obtained, thereby making it possible to provide a fluorescent display device having a very little color tone difference.

While the invention has been shown and described with respect to the preferred embodiments, it will be understood by those skilled in the art that various changes and modification may be made without departing from the scope of the invention as defined in the following claims.

What is claimed is:

1. A vacuum fluorescent display device comprising:
    i) an IC chip,
    ii) one or more bonding wires, wherein each of the bonding wires is connected to an electrode of the IC chip, and
    wherein the IC chip and the bonding wires are entirely coated by a coating material layer including first metal oxide particles; second metal oxide particles ; and third metal oxide particles formed from a metal alkoxide,
    wherein the first and the second metal oxide particles include oxide particles of at least one metal selected from the group consisting of Fe, Cr and Mn and a composition of the first metal oxide particles is different from that of the second metal oxide particles,
    wherein the coating material layer further includes flat particles of a composite oxide, and
    wherein the composite oxide is mica.

2. The vacuum fluorescent display device of claim 1, wherein the coating material layer for coating the IC chip is black.

3. The vacuum fluorescent display device of claim 1, wherein a shape of the first metal oxide particles is different from that of the second metal oxide particles.

4. The vacuum fluorescent display device of claim 1, wherein a thickness of the coating material layer ranges from 50 to 250 µm.

5. The vacuum fluorescent display device of claim 1, wherein a mean particle size ratio of the first metal oxide particles to the second metal oxide particles is set to be equal to or greater than 5.

6. The vacuum fluorescent display device of claim 1, wherein the coating material layer serves as a layer protecting the IC chip from the surroundings thereof.

7. The vacuum fluorescent display device of claim 1, wherein the first metal oxide particles and second metal oxide particles comprise Fe, Mn, and Cr.

8. The vacuum fluorescent display device of claim 1, wherein the third metal oxide particles include alumina as a fixing material which fixes the coating material layer.

9. The vacuum fluorescent display device of claim 1, wherein a size of the metal oxide particles of Fe, Cr or Mn is 3.5 μm and a size of the flat particles is 25 μm.

10. The vacuum fluorescent display device of claim 9, wherein a ratio in weight of the first and the second metal oxide particles to the flat particles is 4 to 1, and a total amount of the first and the second metal oxide and the flat particles ranges from 97 to 99 wt % of the coating material layer.

11. A vacuum fluorescent display device comprising:
 i) an IC chip, and
 ii) one or more bonding wires,
  wherein each of the bonding wires are connected to an electrode of the IC chip,
  wherein the IC chip and the bonding wires are entirely coated by a coating material layer including first metal oxide particles; second metal oxide particles; and third metal oxide particles from a metal alkoxide,
  wherein the first metal oxide particles include oxide particles of at least one metal selected from the group consisting of Fe, Cr, Mn, Al and Si,
  wherein the second metal oxide particles include metal oxide particles of at least one metal oxide selected from the group consisting of Al oxide and Si oxide,
  wherein the coating material layer further includes flat particles of a composite oxide,
  wherein the composite oxide is mica, and
  wherein the first metal oxide particles and second metal oxide particles comprise Fe, Mn, and Cr.

* * * * *